US012666947B2

(12) United States Patent
Chu et al.

(10) Patent No.: US 12,666,947 B2
(45) Date of Patent: Jun. 23, 2026

(54) SEMICONDUCTOR DEVICE INCLUDING SELF-ALIGNED VIA AND METHOD OF MANUFACTURING THE SAME

(71) Applicant: TAIWAN SEMICONDUCTOR MANUFACTURING COMPANY LTD., Hsinchu (TW)

(72) Inventors: Hwei-Jay Chu, Hsinchu City (TW); Hsi-Wen Tien, Hsinchu County (TW); Wei-Hao Liao, Taichung City (TW); Yu-Teng Dai, New Taipei City (TW); Hsin-Chieh Yao, Hsinchu City (TW); Cheng-Hao Chen, Kaohsiung City (TW); Chih Wei Lu, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 376 days.

(21) Appl. No.: 18/482,037

(22) Filed: Oct. 6, 2023

(65) Prior Publication Data

US 2025/0118656 A1 Apr. 10, 2025

(51) Int. Cl.
*H10W 20/42* (2026.01)
*H10W 20/00* (2026.01)
*H10W 20/41* (2026.01)

(52) U.S. Cl.
CPC ......... *H10W 20/42* (2026.01); *H10W 20/033* (2026.01); *H10W 20/077* (2026.01); *H10W 20/435* (2026.01)

(58) Field of Classification Search
CPC ........... H01L 23/5226; H01L 21/76843; H01L 23/5283
USPC ........................................ 257/774
See application file for complete search history.

(56) References Cited

U.S. PATENT DOCUMENTS

| | | | | |
|---|---|---|---|---|
| 6,806,579 | B2 * | 10/2004 | Cowley | H01L 21/76877 |
| | | | | 257/E21.585 |
| 2021/0375723 | A1 * | 12/2021 | Lin | H10W 20/085 |
| 2022/0139944 | A1 * | 5/2022 | Hwang | H01L 23/5226 |
| | | | | 257/314 |
| 2022/0278040 | A1 * | 9/2022 | Chin | H10W 20/033 |

* cited by examiner

*Primary Examiner* — Nduka E Ojeh
(74) *Attorney, Agent, or Firm* — WPAT LAW; Anthony King

(57) ABSTRACT

A semiconductor device and method of manufacturing the same are provided. The semiconductor device includes a substrate, a first conductive line, a first conductive via, a second conductive line, and a first barrier layer. The first conductive line is disposed on the substrate. The first conductive via is disposed on the first conductive line. The second conductive line is disposed on the first conductive line. The first barrier layer is disposed between the first conductive via and the second conductive line.

20 Claims, 19 Drawing Sheets

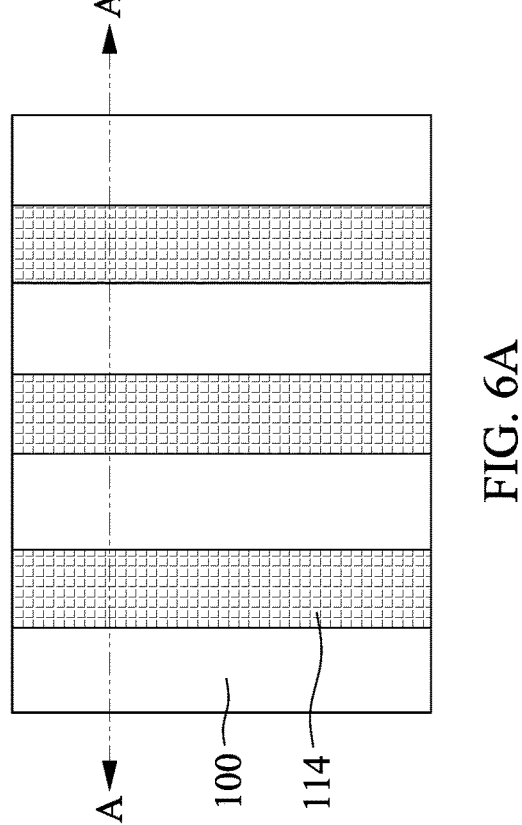
FIG. 6A
100
114
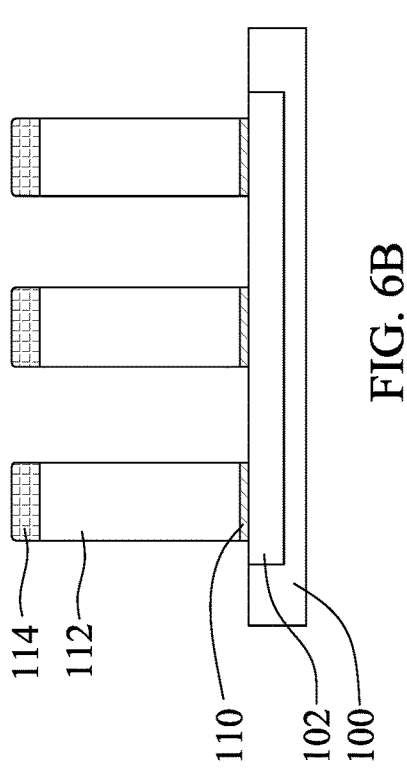
FIG. 6B
114
112
110
102
100
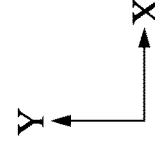

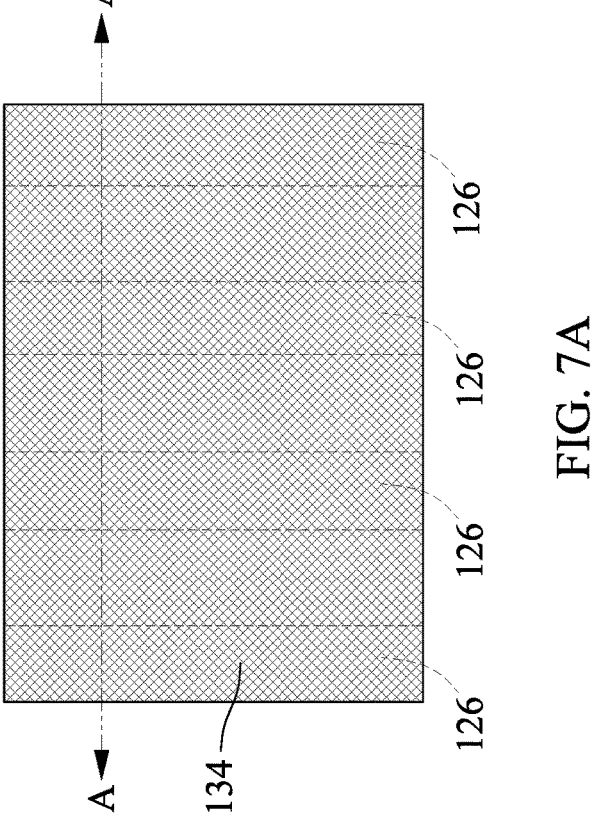
FIG. 7A
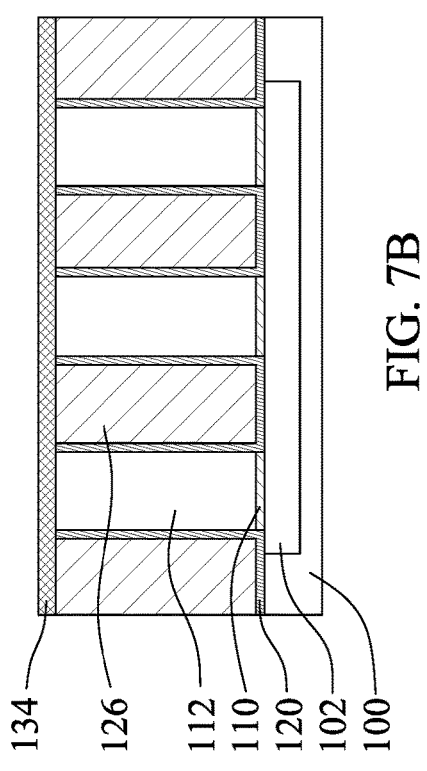
FIG. 7B
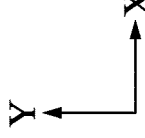

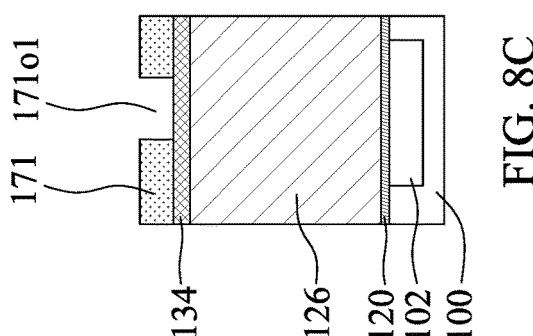
FIG. 8C
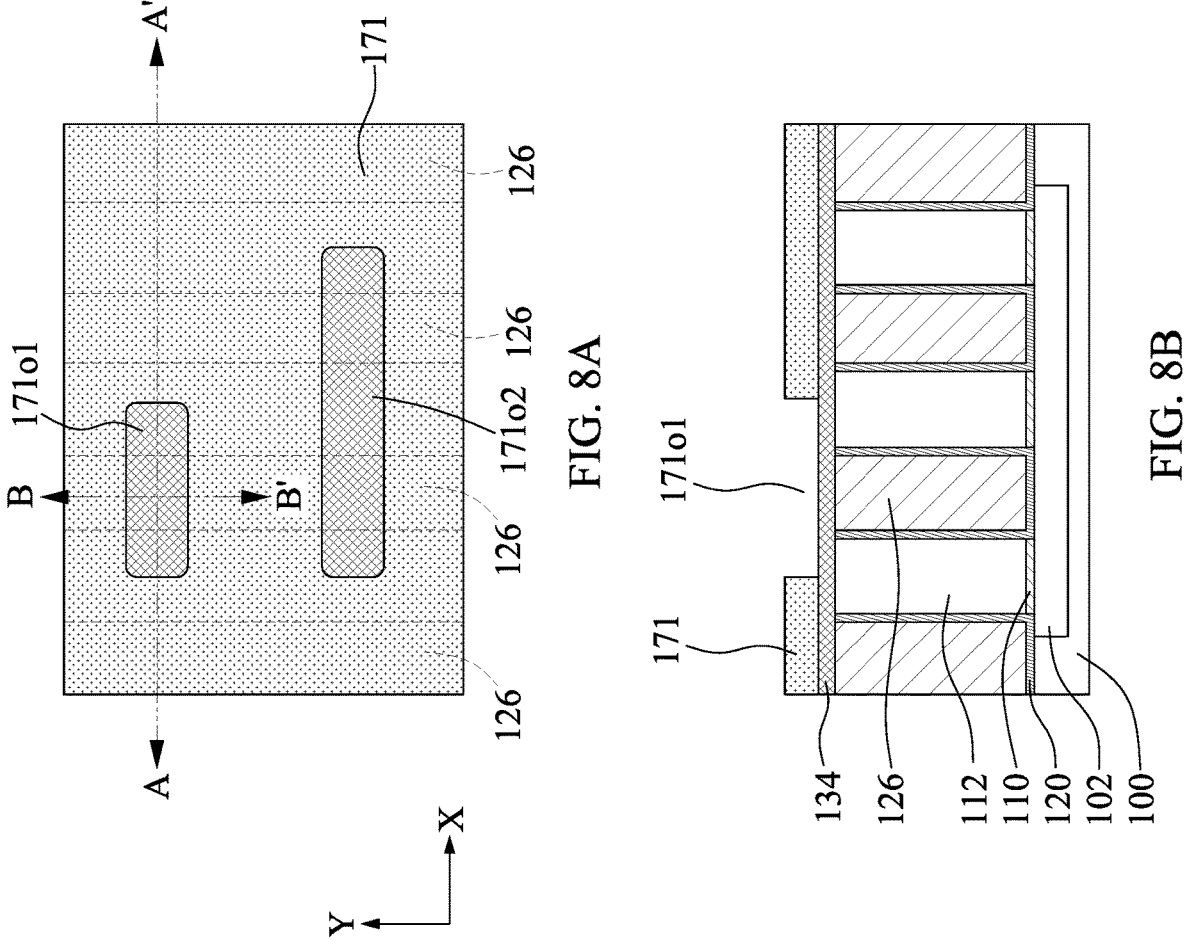
FIG. 8A
FIG. 8B

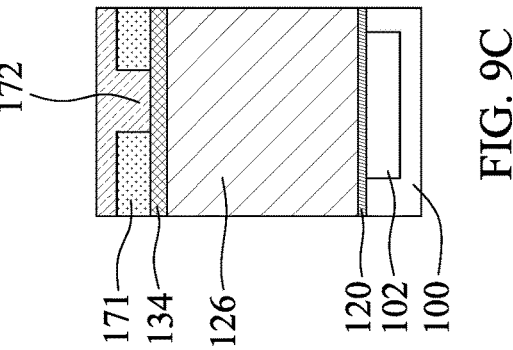
FIG. 9C
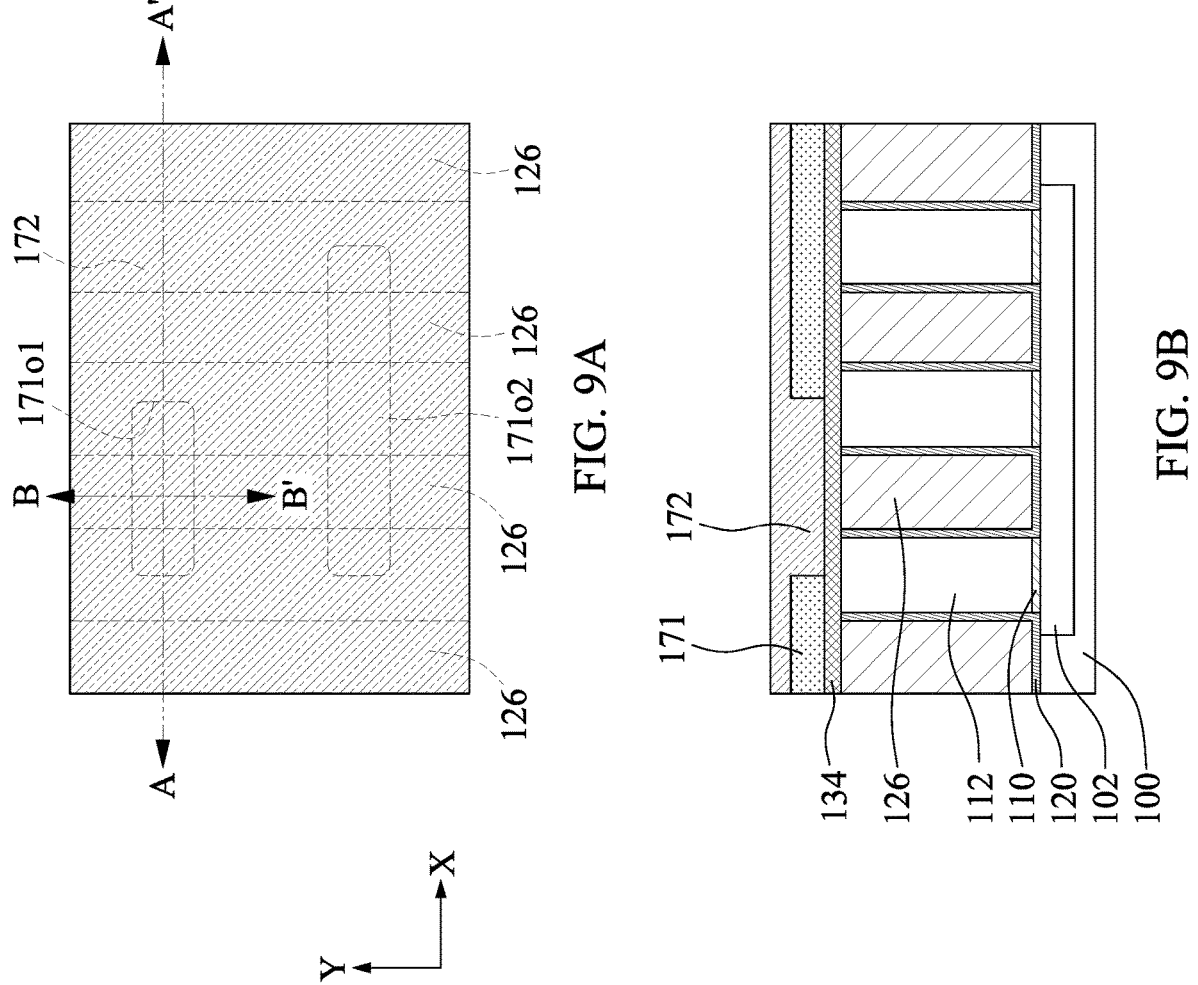
FIG. 9A
FIG. 9B

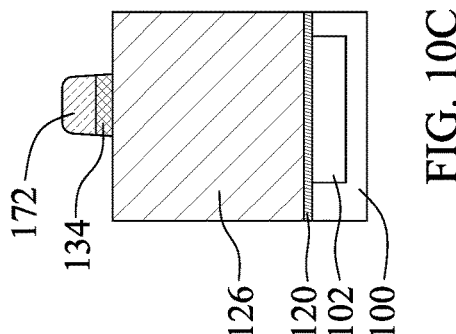
FIG. 10C
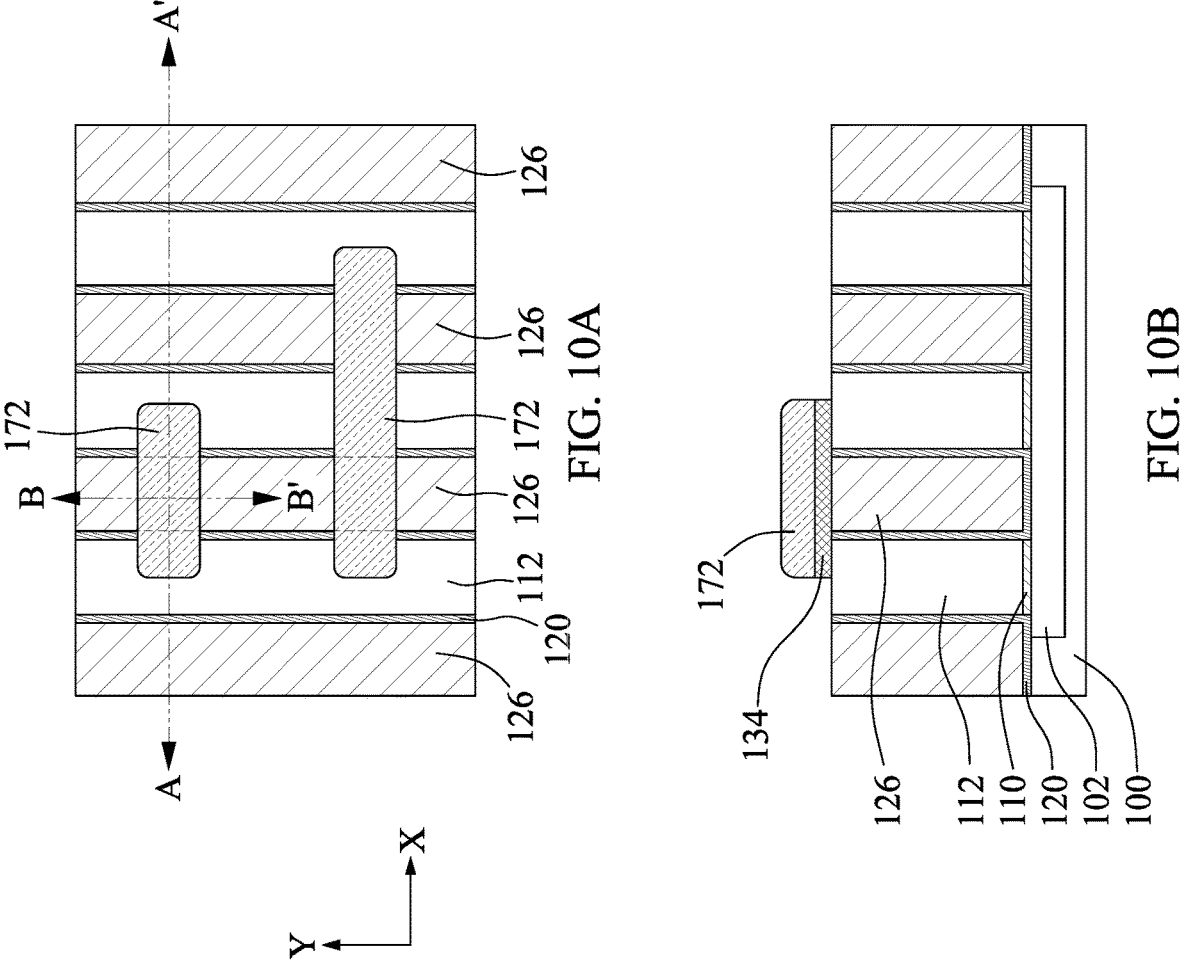
FIG. 10A
FIG. 10B

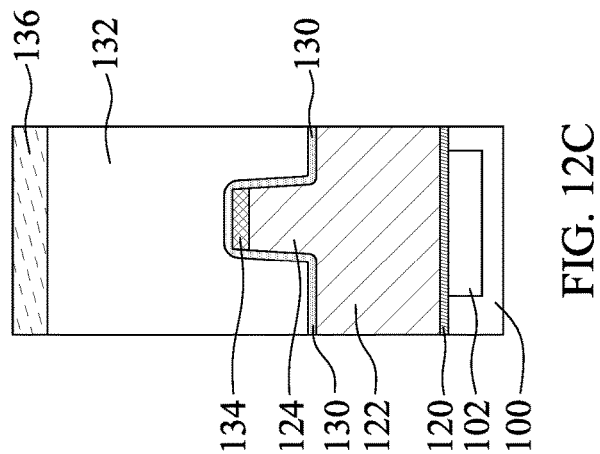
FIG. 12C
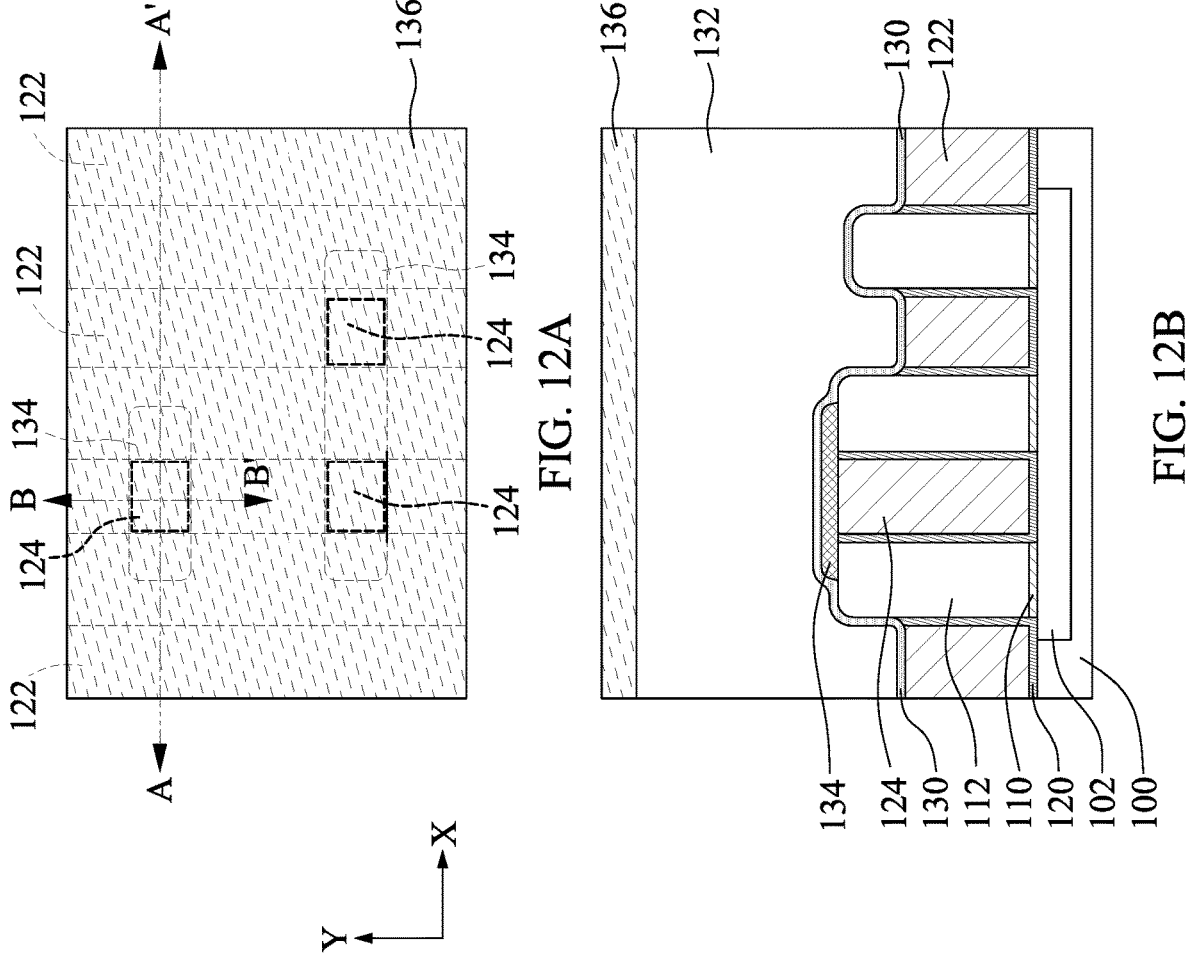
FIG. 12A
FIG. 12B

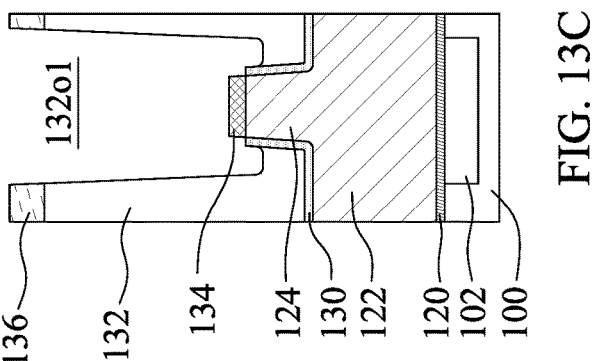
FIG. 13C
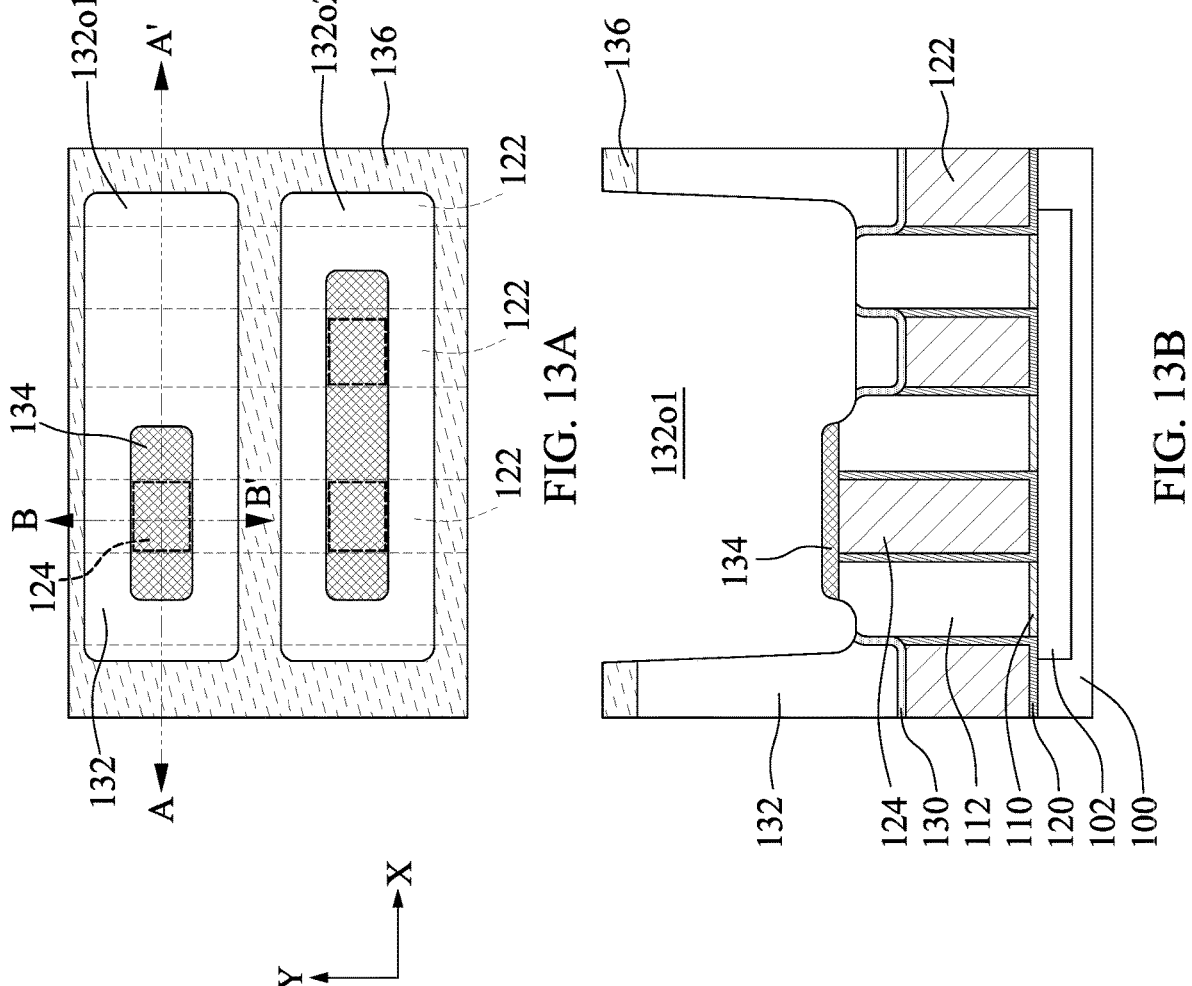
FIG. 13A
FIG. 13B

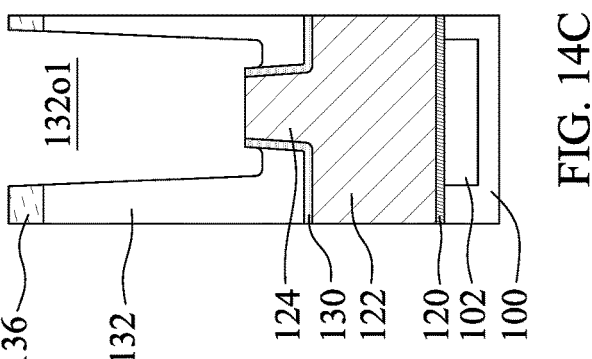
FIG. 14C
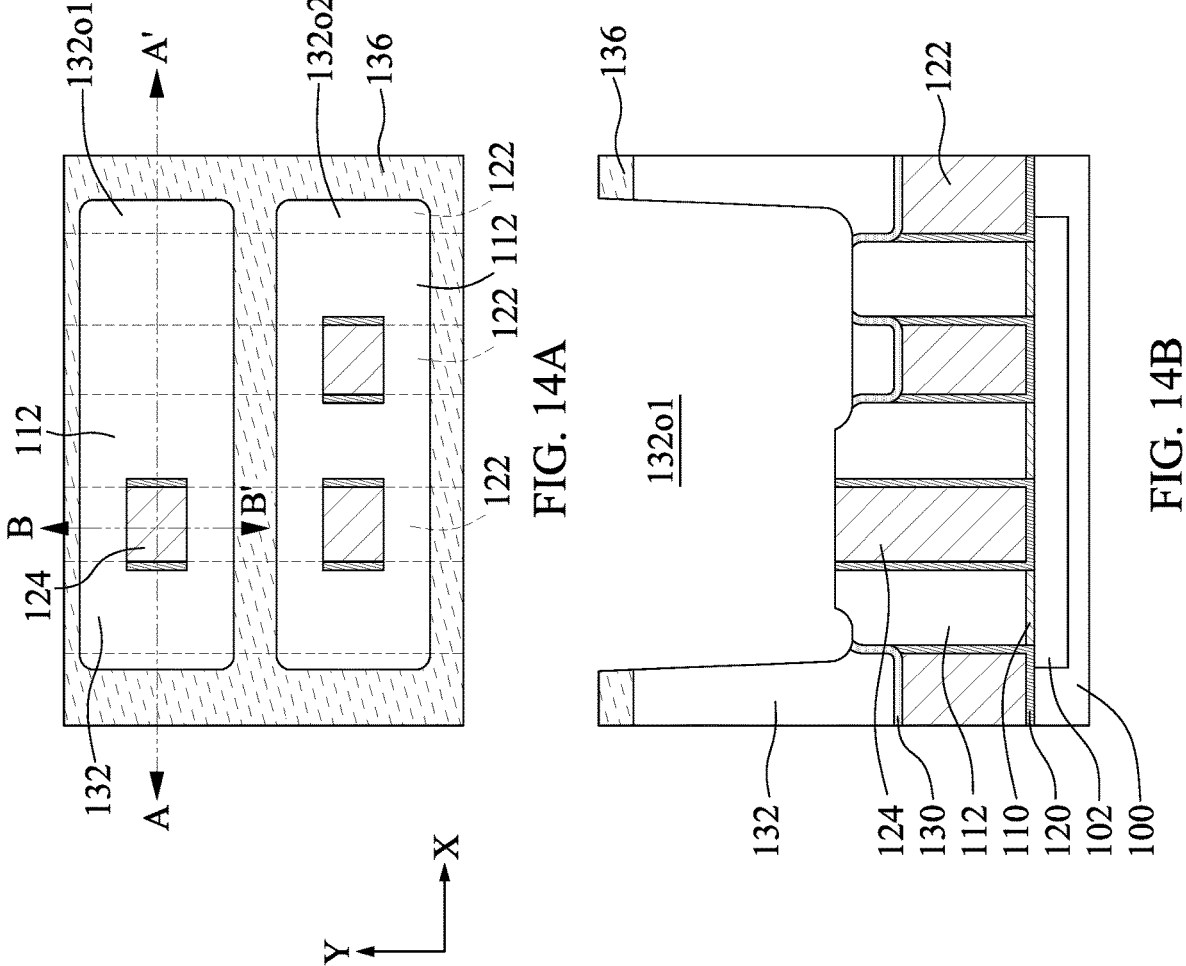
FIG. 14A
FIG. 14B

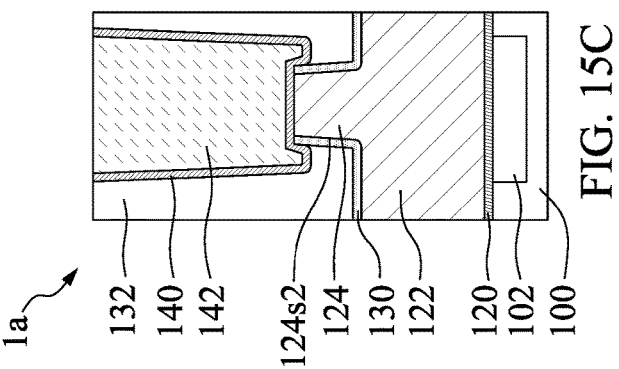
FIG. 15C
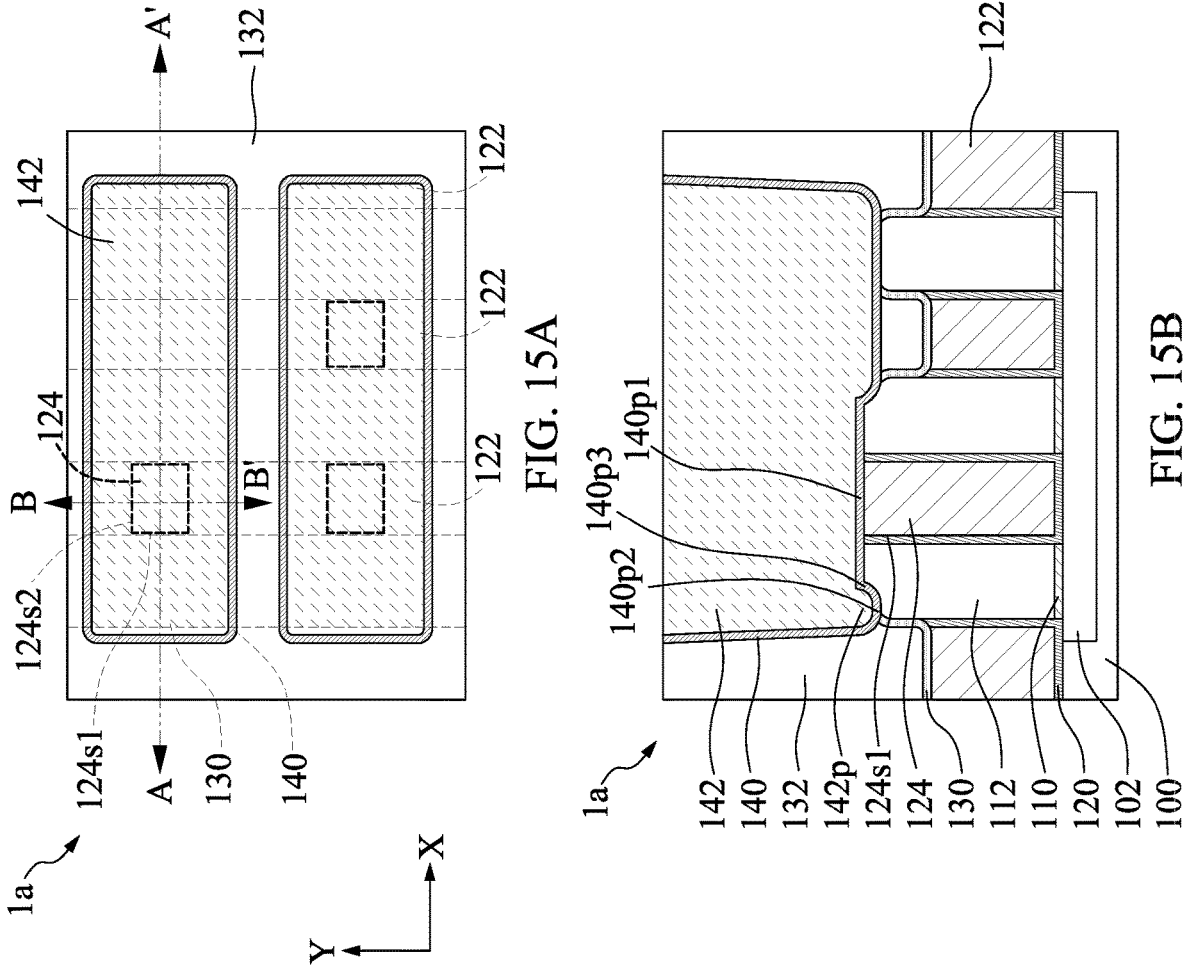
FIG. 15A
FIG. 15B

SEMICONDUCTOR DEVICE INCLUDING SELF-ALIGNED VIA AND METHOD OF MANUFACTURING THE SAME

BACKGROUND

The semiconductor integrated circuit (IC) industry has experienced exponential growth. Technological advances in IC materials and design have produced smaller and more complex circuits each generation. In the course of IC evolution, functional density (i.e., the number of interconnected devices per chip area) has generally increased while geometry size (i.e., the smallest component (or line) that may be created using a fabrication process)) has decreased. This scaling down process generally provides benefits by increasing production efficiency and lowering associated costs.

Such scaling down has also increased the complexity of manufacturing ICs, and for these advances to be realized, corresponding developments in IC manufacturing are needed.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 5A, FIG. 6A, FIG. 7A, FIG. 8A, FIG. 9A, FIG. 10A, FIG. 11A, FIG. 12A, FIG. 13A, FIG. 14A, and FIG. 15A illustrate various stages of top views of manufacturing a semiconductor device, in accordance with some embodiments of the present disclosure.

FIG. 5B, FIG. 6B, FIG. 7B, FIG. 8B, FIG. 9B, FIG. 10B, FIG. 11B, FIG. 12B, FIG. 13B, FIG. 14B, and FIG. 15B illustrate cross-sectional views along line A-A' of FIG. 5A to FIG. 15A, in accordance with some embodiments of the present disclosure.

FIG. 8C, FIG. 9C, FIG. 10C, FIG. 11C, FIG. 12C, FIG. 13C, FIG. 14C, and FIG. 15C illustrate cross-sectional views along line C-C' of FIG. 8A to FIG. 15A, in accordance with some embodiments of the present disclosure.

DETAILED DESCRIPTION

Figures 1A, 1B, 1C:
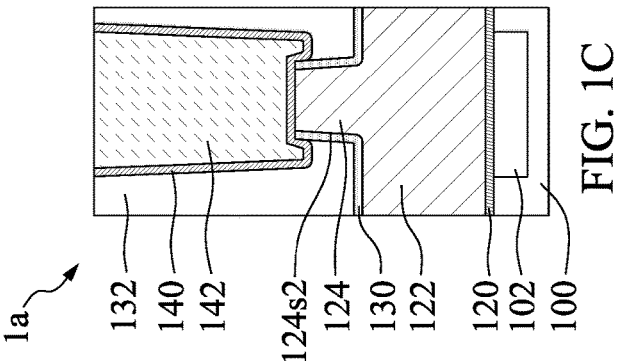
FIG. 1A illustrates a top view of a semiconductor device, in accordance with some embodiments of the present disclosure.
FIG. 1B illustrates a cross-sectional view along line A-A' of the semiconductor device as shown in FIG. 1A, in accordance with some embodiments of the present disclosure.
FIG. 1C illustrates a cross-sectional view along line B-B' of the semiconductor device as shown in FIG. 1A, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1D:
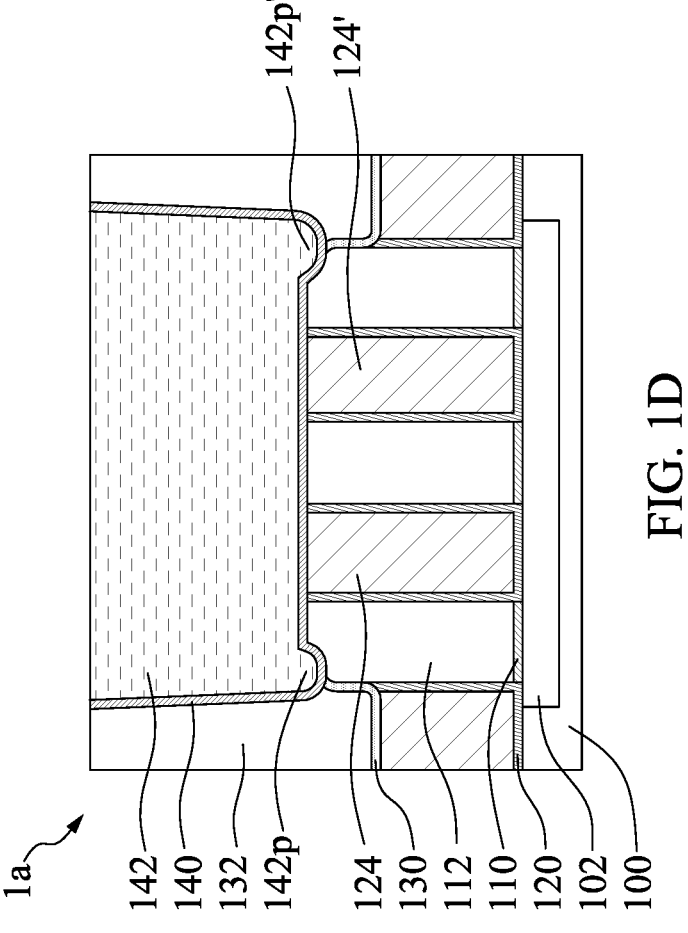
FIG. 1D illustrates a cross-sectional view along line C-C' of the semiconductor device as shown in FIG. 1A, in accordance with some embodiments of the present disclosure.

FIG. 1A, FIG. 1B, FIG. 1C, and FIG. 1D illustrate a semiconductor device 1a, in accordance with some embodiments of the present disclosure, wherein FIG. 1B, FIG. 1C, and FIG. 1D illustrates cross-sectional views along line A-A', line B-B', and line C-C' of the semiconductor device as shown in FIG. 1A, respectively. It should be noted that some elements are omitted from FIG. 1A for brevity.

The semiconductor device 1a depicts a structure including the zero metal layer (M0), the zero via (V0), and the first metal layer (M1) over a substrate. As shown in FIGS. 1A and 1B, the semiconductor device 1a includes a substrate 100. The substrate 100 includes a semiconductor substrate, such as a bulk semiconductor substrate, a semiconductor-on-insulator (SOI) substrate, or the like, which may be doped (e.g., with a p-type or an n-type dopant) or undoped. The substrate 100 may be a semiconductor wafer, such as a silicon wafer. Generally, an SOI substrate includes a layer of a semiconductor material (e.g., silicon) formed on an insulator layer. The insulator layer may be, for example, a buried oxide (BOX) layer, a silicon oxide layer, or the like. The insulator layer is provided on a substrate, typically silicon or glass substrate. Other substrates, such as a multi-layered or gradient substrate, may also be used. In some embodiments, the semiconductor material of the substrate 100 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

In some embodiments, the substrate 100 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various active devices (or integrated circuit (IC) devices), such as a complimentary metal-oxide-semiconductor field-effect transistor (CMOSFET). The substrate 100 may further include other devices (functional features) such as a resistor or a capacitor formed in and on the substrate. The substrate 100 further includes lateral isolation features provided to separate various devices formed in the substrate 100. In one embodiment, shallow recess isolation (STI) features are used for lateral isolation.

The semiconductor device 1a includes a conductive feature 102. In some embodiments, the conductive feature 102 may be a source, drain or gate electrode of a transistor device. Alternatively, the conductive feature 102 may be a silicide feature disposed on a source, drain or gate electrode. The silicide feature may be formed by a self-aligned silicide technique. In another embodiment, the conductive feature 102 may include contacts, which includes conductive materials, over the silicide feature. In another embodiment, the conductive feature 102 may include an electrode of a capacitor or one end of a resistor. The substrate 100 further includes dielectric layers, such as an interlayer dielectric (ILD) and other suitable dielectric layers, over the semiconductor substrate.

The semiconductor device 1a includes an etch stop layer 110. The etch stop layer 110 is disposed on or over the substrate 100. In some embodiments, the etch stop layer 110 includes silicon carbide, silicon oxide, silicon nitride, silicon oxycarbide, silicon carbonitride, silicon oxynitride, aluminum oxide, aluminum oxynitride, or other suitable materials.

The semiconductor device 1a includes a dielectric layer 112. The dielectric layer 112 is disposed on over the etch stop layer 110. In some embodiments, the dielectric layer 112 includes silicon carbide, silicon oxide, silicon nitride, silicon oxycarbide, silicon carbonitride, silicon oxynitride, or other suitable materials. The material of the dielectric layer 112 is different from that of the etch stop layer 110 so that the etch stop layer 110 and dielectric layer 112 have different etching selectivities to an etchant(s). The etch stop layer 110 and the dielectric layer 112 collectively define multiple openings (not annotated) within which conductive lines are disposed.

The semiconductor device 1a includes barrier layers 120. Each of the barrier layers 120 is located within the opening of the etch stop layer 110 and the dielectric layer 112. The barrier layer 120 is disposed on the sidewall of the etch stop layer 110 and the dielectric layer 112. The barrier layer 120 is disposed on or over the substrate 100. In some embodiments, the barrier layer 120 includes barrier materials that enhance (e.g., improves) conductivity of conductive materials and effectively prevents (e.g., block) metal atoms from diffusing from conductive materials into non-conductive materials during a deposition process. The barrier layer 120 includes metal, metal oxide, metal nitride, metal carbide, metal alloy, or suitable materials. For example, the barrier layer 120 includes tantalum nitride, tantalum, titanium nitride, titanium, cobalt tungsten, tungsten nitride, or the like.

The semiconductor device 1a includes conductive lines 122. Each of the conductive lines 122 is located within the opening of the etch stop layer 110 and the dielectric layer 112. Each of the conductive lines 122 extends along the Y direction. The conductive line 122 is disposed on the barrier layer 120. The conductive line 122 is spaced apart from the dielectric layer 112 (or etch stop layer 110) by the barrier layer 120. The conductive line 122 is electrically connected to the conductive feature 102 through the barrier layer 120. In some embodiments, the conductive line 122 includes tungsten, copper, ruthenium, iridium, nickel, osmium, rhodium, aluminum, molybdenum, cobalt, tantalum, alloys thereof, and combinations thereof. The conductive line 122 may also be referred to as the zero metal layer (M0), which is electrically connected to, for example, a conductive contact.

The semiconductor device 1a includes conductive vias 124. Each of the conductive vias 124 is located within the opening of the etch stop layer 110 and the dielectric layer 112. In some embodiments, the conductive via 124 protrudes upwardly from the conductive line 122. In some embodiments, the conductive via 124 has a quadrangle profile (e.g., rectangular profile or a square profile) from a top view, leading to a greater area (e.g., surface area). In some embodiments, the conductive via 124 has a circular profile from the top view. In some embodiments, the conductive via 124 has an oval profile from the top view. In some embodiments, the conductive via 124 includes tungsten, copper, ruthenium, iridium, nickel, osmium, rhodium, aluminum, molybdenum, cobalt, tantalum, alloys thereof, and combinations thereof. The conductive via 124 may also be referred to as a zero conductive via (V0), which is defined as a conductive via connected to and over the M0.

The conductive via 124 has a side 124s1 (or a lateral surface) and a side 124s2 (or a lateral surface) abutting (or connected to) the side 124s1. As shown in FIG. 1A, the side 124s1 extends along the Y direction, and the side 124s2 extends along the X direction. In some embodiments, the side 124s1 and side 124s2 have different slopes, which may be defined as an angle between the normal direction of the upper surface of the substrate 100 and the side (e.g., 124s1 or 124s2) of the conductive via 124. Although FIG. 1B illustrates that the side 124s1 is substantially parallel to the normal direction of the upper surface of the substrate 100, the angle between the side 124s1 and the normal direction of the upper surface of the substrate 100 may range from about 45 degrees to about 90 degrees; as shown in FIG. 1C, the side 124s2 is nonparallel to (or slanted relative to) the normal direction of the upper surface of the substrate 100. The angle between the side 124s2 and the normal direction of the upper surface of the substrate 100 may range from about 45 degrees to about 85 degrees In some embodiments, the angle between the side 124s1 and the normal direction of the upper surface of the substrate 100 is different from the angle between the side 124s2 and the normal direction of the upper surface of the substrate 100. In some embodiments, the side 124s1 is steeper than the side 124s2. In some embodiments, the conductive via 124 is tapered along a direction far away from the conductive line 122 as shown in FIG. 1C. In some embodiments, the conductive via 124 is tapered upwardly from the conductive line 122. Although FIG. 1B illustrates that the side 124s1 of the conductive via 124 (and the sidewall of the conductive line 122) is substantially parallel to the normal direction of the upper surface of the substrate 100, the side 124s1 of the conductive via 124 (and the sidewall of the conductive line 122) may be slanted with respect to the upper surface of the substrate 100. In this condition, the conductive via 124 (and the conductive line 122) in this cross-section is tapered toward the substrate 100. In some embodiments, the side 124s1 of the conductive via 124 is substantially coplanar with a side 122s1 (or a lateral surface) of the conductive line 122.

In some embodiments, the conductive line 122 and the conductive via 124 collectively define a monolithic structure. That is, no boundaries (or interfaces) can be detected by a scanning electron microscope (SEM) image, transmission electron microscopy (TEM) image, or other optical images between the conductive line 122 and the conductive via 124. In some embodiments, no barrier layers, such as a layer including tantalum nitride, tantalum, titanium nitride, titanium, cobalt tungsten, tungsten nitride, or the like, is disposed between the conductive line 122 and the conductive via 124. The formation of the conductive line 122 and the conductive via 124 will be described in detail with reference to FIG. 8A to FIG. 11A, FIG. 8B to FIG. 11B, and FIG. 8C to FIG. 11C.

The semiconductor device 1a includes a protective layer 130. In some embodiments, the protective layer 130 is disposed on or contacts the sidewall of the dielectric layer 112. In some embodiments, the protective layer 130 is disposed on or contacts the upper surface of the barrier layer 120. In some embodiments, the protective layer 130 is disposed on or contacts the upper surface of the conductive line 122. In some embodiments, the protective layer 130 is disposed on or contacts the side 124s2 of the conductive via 124. In some embodiments, the side 124s1 of the conductive via 124 is spaced apart from or not covered by the protective layer 130. The protective layer 130 is configured to protect the conductive line 122 (or the barrier layer 120) in a stage of defining the profile of conductive lines (e.g., M1), which involves an etching technique that removes a dielectric material(s). In some embodiments, the protective layer 130 includes silicon, silicon oxide, silicon nitride, silicon carbide, silicon oxynitride, silicon oxycarbide, metal nitride, metal oxide, or other suitable materials.

The semiconductor device 1a includes a dielectric layer 132. The dielectric layer 132 is disposed on or over the conductive via 124. The dielectric layer 132 is disposed on or over the protective layer 130. The dielectric layer 132 includes silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 132 includes low-k dielectric material with a dielectric constant lower than 4, or extreme low-k (ELK) dielectric material with a dielectric constant lower than 2.5. In some embodiments, the low-k material includes a polymer-based material, such as benzocyclobutene (BCB); or a silicon dioxide-based material, such as hydrogen silsesquioxane (HSQ) or SiOF. The dielectric layer 132 may be a single layer structure or a multi-layer structure. The dielectric layer 132 defines multiple openings for accommodating conductive lines (e.g., M1).

The semiconductor device 1a includes barrier layers 140. Each of the barrier layers 140 is located within the opening of the dielectric layer 132. The barrier layer 140 is disposed on the sidewall of the dielectric layer 132. The barrier layer 140 is disposed on or over the dielectric layer 112. The barrier layer 140 is disposed on or over the protective layer 130. The barrier layer 140 is disposed on or over the barrier layer 120. The barrier layer 140 is disposed on or over the conductive via 124. In some embodiments, the barrier layer 140 includes barrier materials that enhance (e.g., improves) conductivity of conductive materials and effectively prevents (e.g., blocks) metal atoms from diffusing from conductive materials into non-conductive materials during a deposition process. The barrier layer 140 includes metal, metal oxide, metal nitride, metal carbide, metal alloy, or suitable materials. For example, the barrier layer 140 includes tantalum nitride, tantalum, titanium nitride, titanium, cobalt tungsten, tungsten nitride, or the like.

In some embodiments, the barrier layer 140 has a portion 140p1 (or a lower portion) and a portion 140p2 (or a lower portion) located at different heights with respect to the substrate 100. The portion 140p1 is located at a greater height than that of the portion 140p2. The portion 140p1 of the barrier layer 140 is in contact with the upper surface of the conductive via 124. The portion 140p2 of the barrier layer 140 is in contact with a portion of the upper surface of the dielectric layer 112. The portion 140p2 of the barrier layer 140 is in contact with the dielectric layer 132. The portion 140p2 of the barrier layer 140 is laterally set back from the conductive via 124 by a non-zero distance. In some embodiments, the portion 140p2 is closer to the sidewall of the dielectric layer 132 than the portion 140p1 is. In some embodiments, the portion 140p1 is connected to the portion 140p2 by a connection portion 140p3. In some embodiments, the connection portion 140p3 has a rounded or curved surface (or profile).

The semiconductor device 1a includes a conductive line 142. The conductive line 142 is located within the opening of the dielectric layer 132. The conductive line 142 extends along the X direction. The conductive line 142 is disposed on the barrier layer 140. In some embodiments, the conductive line 142 is spaced apart from the conductive via 124 by the barrier layer 140. The conductive line 142 is electrically connected to the conductive line 122 through the conductive via 124. In some embodiments, the conductive line 142 is tapered toward the substrate 100. In some embodiments, the conductive line 142 includes tungsten, copper, ruthenium, iridium, nickel, osmium, rhodium, aluminum, molybdenum, cobalt, tantalum, alloys thereof, and combinations thereof. The conductive line 142 may also be referred to as the first metal layer (M1), which is connected to and over the V0.

In some embodiments, the conductive line 142 has one or more protrusions 142p, each of which protrudes toward the substrate 100. In some embodiments, the protrusion 142p is disposed on or over the portion 140p2 of the barrier layer 140. In some embodiments, the protrusion 142p is disposed adjacent to the sidewall of the dielectric layer 132. In some embodiments, the protrusion 142p of the conductive line 142 is spaced apart from the conductive via 124. In some embodiments, the protrusion 142p laterally overlaps the conductive via 124.

In some embodiments, the conductive line 142 is electrically connected to one conductive via 124 as shown in FIG. 1B. In some embodiments, the conductive line 142 is electrically connected to two or more conductive vias. Referring to FIG. 1D, the conductive line 142 is electrically connected to two conductive vias 124 and 124'. In some embodiments, the barrier layer 140 continuously extends from the conductive via 124 to the conductive via 124'. In some embodiments, the conductive vias 124 and the 124' are disposed between the protrusions 142p and 142p'.

Figure 2B:
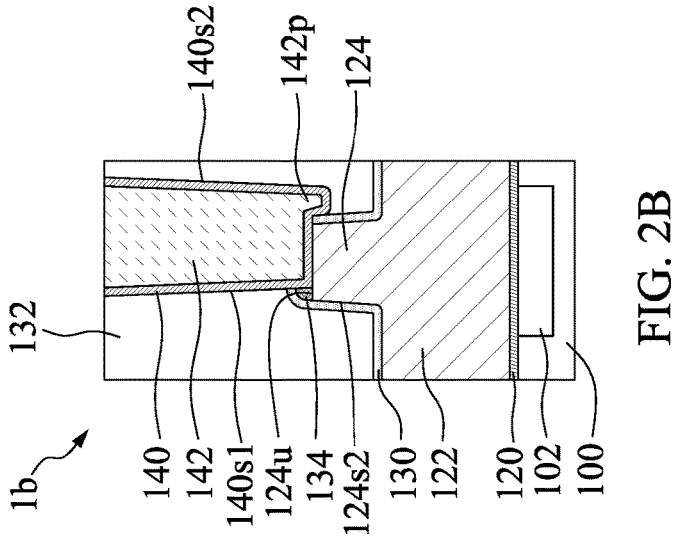
FIG. 2B illustrates a cross-sectional view along line D-D' of the semiconductor device as shown in FIG. 2A, in accordance with some embodiments of the present disclosure.
Figure 2A:
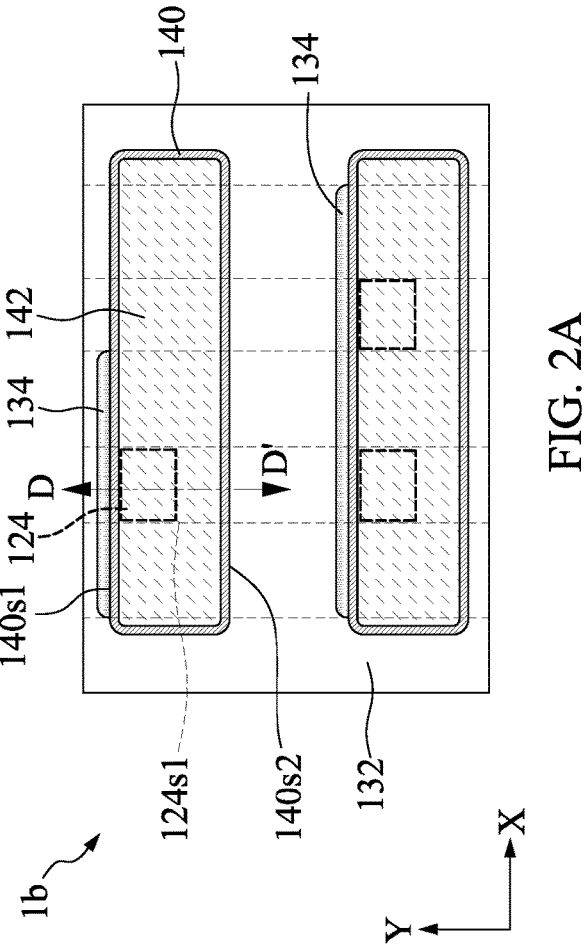
FIG. 2A illustrates a top view of a semiconductor device, in accordance with some embodiments of the present disclosure.

FIG. 2A and FIG. 2B illustrate a semiconductor device 1b, in accordance with some embodiments of the present disclosure. FIG. 2A is a top view, and FIG. 2B illustrates a cross-sectional view along line D-D' of FIG. 2A. The semiconductor device 1b has a structure similar to that of the semiconductor device 1a. One of the differences between the semiconductor devices 1a and 1b is that an overlay shift occurs, which causes the conductive line 142 and the conductive via 124 to have an offset along the Y direction.

In some embodiments, a portion of a surface 124u (or upper surface) of the conductive via 124 is exposed by the conductive line 142. In some embodiments, a portion of the surface 124u of the conductive via 124 is exposed by the conductive line 142. In some embodiments, the semiconductor device 1b includes an etch stop layer 134. In some embodiments, the etch stop layer 134 is disposed on or over the surface 124u. In some embodiments, the etch stop layer 134 is covered by the protective layer 130. In some embodiments, the protrusion 142p and the etch stop layer 134 are located on two opposite sides of the conductive line 142. The barrier layer 140 has a side 140s1 (or a lateral surface) and a side 140s2 (or a lateral surface) opposite to the side 140s1, both of which extend along the X direction. In some embodiments, the etch stop layer 134 is in contact with a portion of the side 140s1 of the barrier layer 140. In some embodiments, the etch stop layer 134 is spaced apart from the side 140s2 of the barrier layer 140. In some embodiments, the sidewall of the conductive via 124 is spaced apart from or free from laterally overlapping the etch stop layer 134. For example, the side 124s1 of the conductive via 124 is free from laterally overlapping the etch stop layer 134; the side 124s2 of the conductive via 124 is free from laterally overlapping the etch stop layer 134.

Figures 3A, 3B:
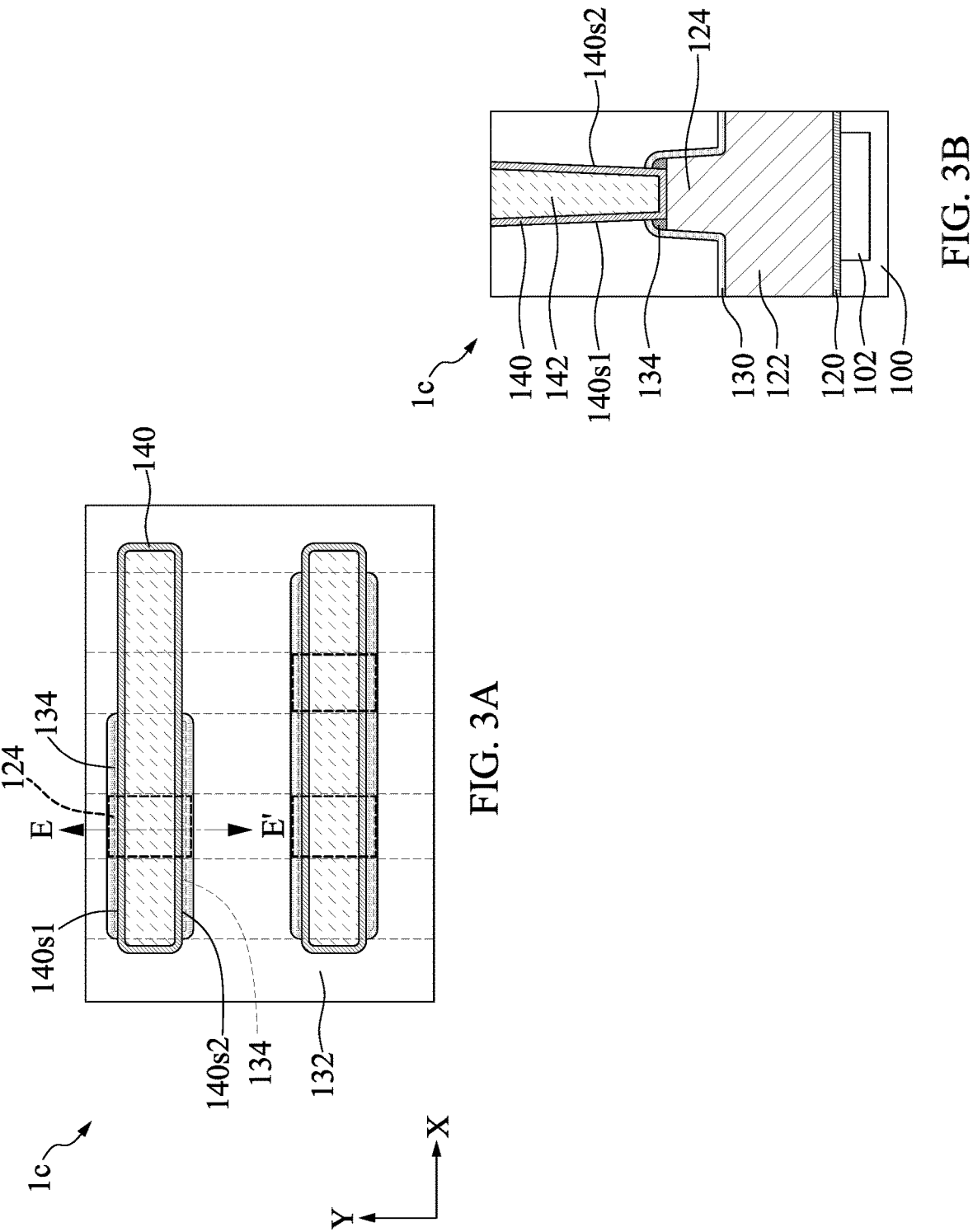
FIG. 3A illustrates a top view of a semiconductor device, in accordance with some embodiments of the present disclosure.
FIG. 3B illustrates a cross-sectional view along line E-E' of the semiconductor device as shown in FIG. 3A, in accordance with some embodiments of the present disclosure.

FIG. 3A and FIG. 3B illustrate a semiconductor device 1c, in accordance with some embodiments of the present disclosure. FIG. 3A is a top view, and FIG. 3B illustrates a cross-sectional view along line E-E' of FIG. 3A. The semiconductor device 1c has a structure similar to that of the semiconductor device 1a. One of the differences between the semiconductor devices 1a and 1c is that the width of the conductive line 142 (or the width of the opening defined by the dielectric layer 132) is less than that of the conductive via 124 along the Y direction. In some embodiments, the etch stop layer 134 is in contact with a portion of the side 140s1 and a portion of the side 140s2 of the barrier layer 140.

Figure 4A:
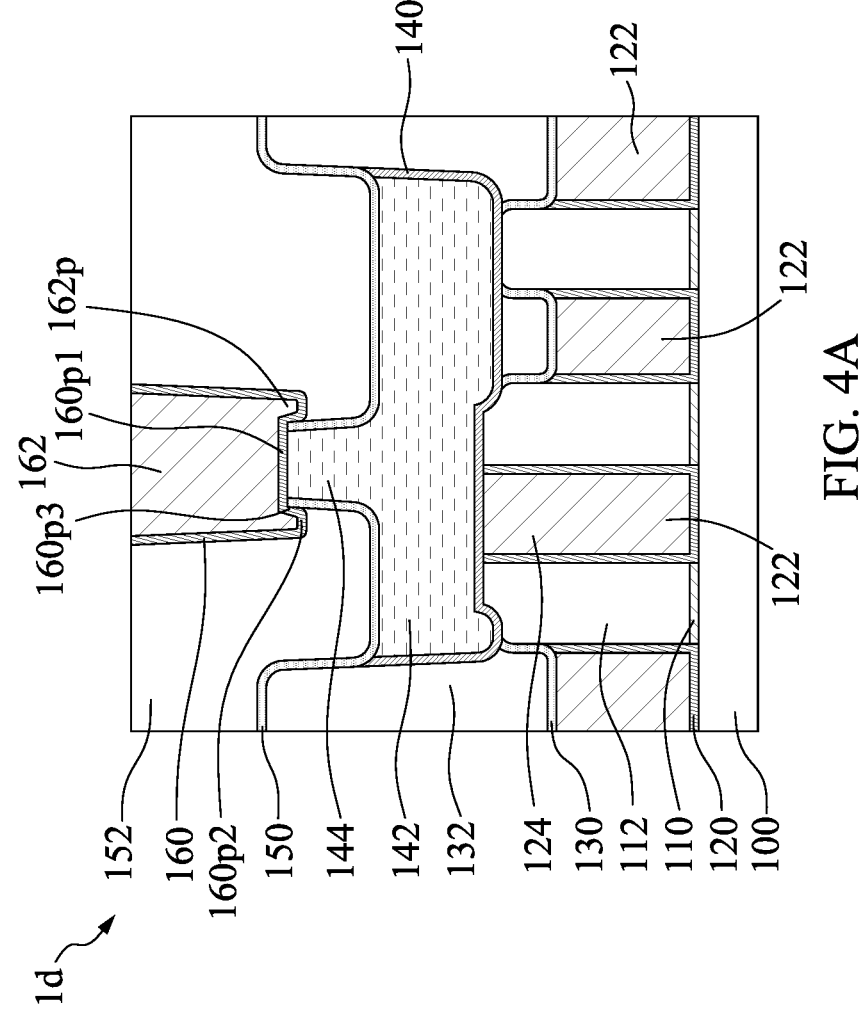
FIG. 4A illustrates a cross-sectional view of a semiconductor device, in accordance with some embodiments of the present disclosure.

FIG. 4A illustrates a cross-sectional view of a semiconductor device 1d, in accordance with some embodiments of the present disclosure. The semiconductor device 1d has a structure similar to that of the semiconductor device 1a. One of the differences between the semiconductor devices 1a and 1d is that the semiconductor device 1d further includes a conductive via 144, a protective layer 150, a dielectric layer 152, a barrier layer 160, and a conductive line 162.

In some embodiments, the protective layer 150 is disposed on or contacts the sidewall of the dielectric layer 132. In some embodiments, the protective layer 150 is disposed on or contacts the upper surface of the dielectric layer 132. In some embodiments, the protective layer 150 is disposed on or contacts the upper surface of the barrier layer 140. In some embodiments, the protective layer 150 is disposed on or contacts the upper surface of the conductive line 142. The protective layer 150 is configured to protect the conductive line 142 (or the barrier layer 140) in a stage of defining the profile of conductive lines (e.g., M2), which involves an etching technique. In some embodiments, the protective layer 150 includes silicon, silicon oxide, silicon nitride, silicon carbide, silicon oxynitride, silicon oxycarbide, metal nitride, metal oxide, or other suitable materials.

The dielectric layer 152 is disposed on or over the protective layer 150. The dielectric layer 152 includes silicon oxide, carbon-containing oxide such as silicon oxycarbide, silicate glass, tetraethylorthosilicate oxide, un-doped silicate glass, or doped silicon oxide such as borophosphosilicate glass, fluorine-doped silica glass, phosphosilicate glass, boron doped silicon glass, combinations thereof and/or other suitable dielectric materials. The dielectric layer 152 defines multiple openings for accommodating conductive lines (e.g., M2) and/or conductive vias (e.g., V1).

Each of the conductive vias 144 is located within the opening of the dielectric layer 152. The conductive via 144 protrudes upwardly from the conductive line 142. In some embodiments, the conductive via 144 includes tungsten, copper, ruthenium, iridium, nickel, osmium, rhodium, aluminum, molybdenum, cobalt, tantalum, alloys thereof, and combinations thereof. The conductive via 144 may also be referred to as the first conductive via (V1), which is defined as a conductive via connecting to and over the M1.

In some embodiments, the conductive line 142 and the conductive via 144 collectively define a monolithic structure. That is, no boundaries (or interfaces) can be detected by a scanning electron microscope (SEM) image, transmission electron microscopy (TEM) image, or other optical images between the conductive line 142 and the conductive via 144. In some embodiments, no barrier layers, such as a layer including tantalum nitride, tantalum, titanium nitride, titanium, cobalt tungsten, tungsten nitride, or the like, are disposed between the conductive line 142 and the conductive via 144.

The barrier layer 160 is located within the opening of the dielectric layer 152. The barrier layer 160 is disposed on the sidewall of the dielectric layer 152. The barrier layer 160 is disposed on or over the protective layer 150. The barrier layer 160 is disposed on or over the conductive via 144. In some embodiments, the barrier layer 160 includes barrier materials that enhance (e.g., improve) conductivity of conductive materials and effectively prevent (e.g., block) metal atoms from diffusing from conductive materials into nonconductive materials during a deposition process. The barrier layer 160 includes tantalum nitride, tantalum, titanium nitride, titanium, cobalt tungsten, tungsten nitride, or the like.

In some embodiments, the barrier layer 160 has a portion 160p1 (or a lower portion) and a portion 160p2 (or a lower portion) located at different heights with respect to the substrate 100. The portion 160p1 is located at a greater height than that of the portion 160p2. The portion 160p1 of the barrier layer 160 is in contact with the upper surface of the conductive via 144. The portion 160p2 of the barrier layer 160 is in contact with the dielectric layer 152. In some embodiments, the portion 160p2 is closer to the sidewall of the dielectric layer 152 than the portion 160p1 is. In some embodiments, the portion 160p1 is connected to the portion 160p2 by a connection portion 160p3. In some embodiments, the connection portion 160p3 has a rounded or curved surface (or profile).

The conductive line 162 is located within the opening of the dielectric layer 152. The conductive line 162 is disposed on the barrier layer 160. The conductive line 162 is spaced apart from the conductive via 144 by the barrier layer 160. The conductive line 162 is electrically connected to the conductive line 142 through the conductive via 144. In some embodiments, the conductive line 162 includes tungsten, copper, ruthenium, iridium, nickel, osmium, rhodium, aluminum, molybdenum, cobalt, tantalum, alloys thereof, and combinations thereof. The conductive line 162 may also be referred to as a second metal layer (M2), which is connected to and over the V1.

In some embodiments, the conductive line 162 has one or more protrusions 162p, each of which protrudes towards the substrate 100. In some embodiments, the protrusion 162p is disposed on or over the portion 160p2 of the barrier layer 160. In some embodiments, the protrusion 162p is disposed adjacent to the sidewall of the dielectric layer 152. In some embodiments, the protrusion 162p of the conductive line 162 is laterally spaced apart from the conductive via 144. In some embodiments, the protrusion 162p laterally overlaps the conductive via 144.

Figure 4B:
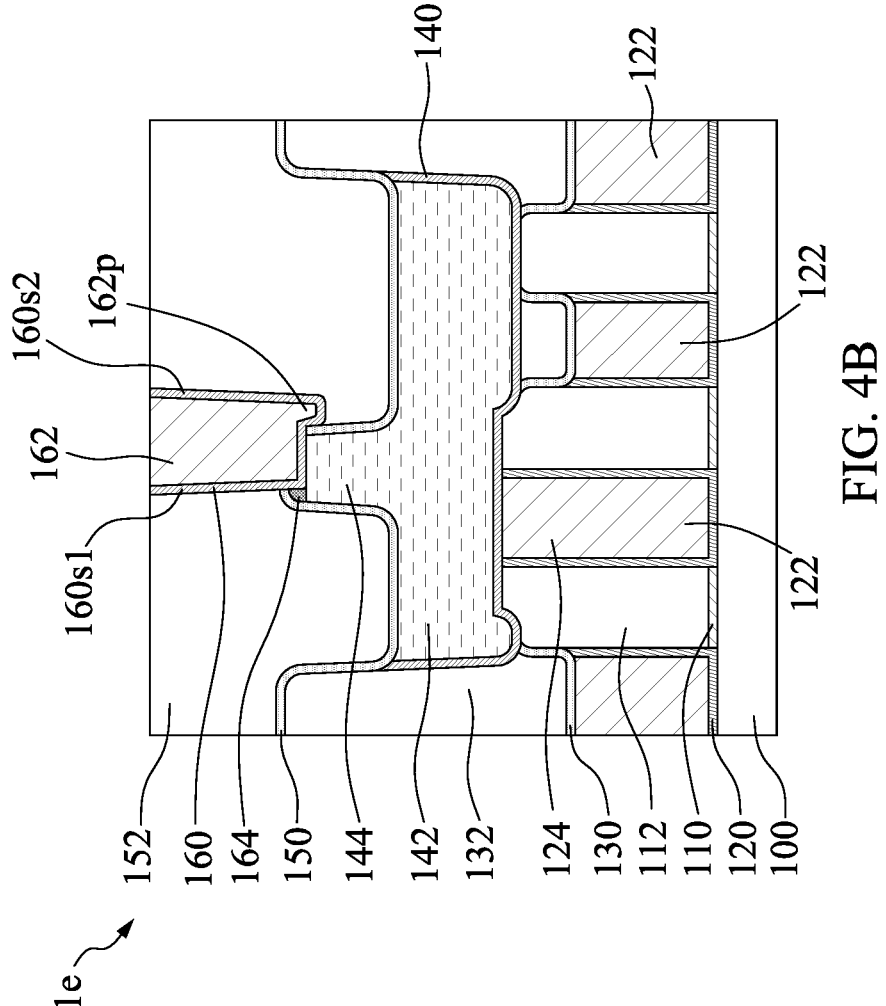
FIG. 4B illustrates a cross-sectional view of a semiconductor device, in accordance with some embodiments of the present disclosure.

FIG. 4B illustrates a cross-sectional view of a semiconductor device 1e, in accordance with some embodiments of the present disclosure. The semiconductor device 1e has a structure similar to that of the semiconductor device 1d. One of the differences between the semiconductor devices 1d and

1e is that the semiconductor device 1e further includes an etch stop layer 164. In some embodiments, a portion of the upper surface of the conductive via 144 is exposed by the conductive line 162. In some embodiments, the etch stop layer 164 is disposed on or over the upper surface of the conductive via 144. In some embodiments, the etch stop layer 134 is covered by the protective layer 150. In some embodiments, the protrusion 162p and the etch stop layer 164 are located on two opposite sides of the conductive line 162. The barrier layer 160 has a side 160s1 (or a lateral surface) and a side 160s2 (or a lateral surface) opposite to the side 160s1. In some embodiments, the etch stop layer 164 is in contact with a portion of the side 160s1 of the barrier layer 160. In some embodiments, the etch stop layer 164 is spaced apart from the side 160s2 of the barrier layer 160.

Figure 4C:
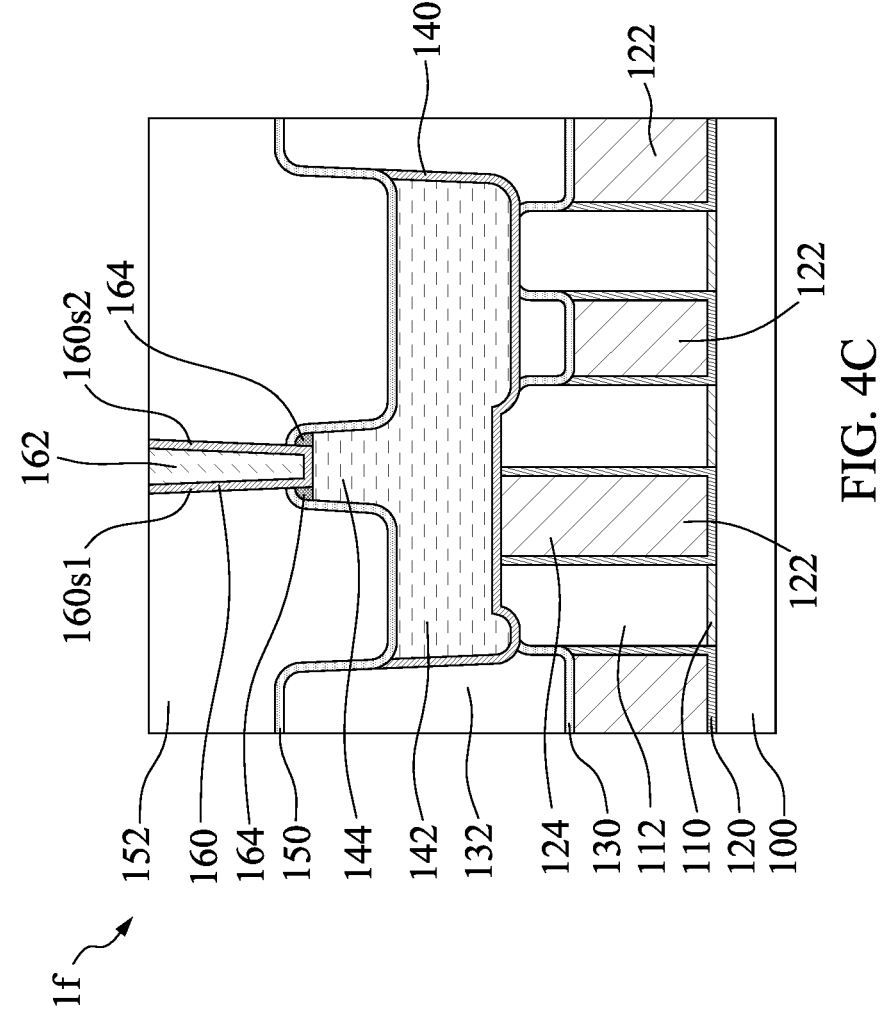
FIG. 4C illustrates a cross-sectional view of a semiconductor device, in accordance with some embodiments of the present disclosure.

FIG. 4C illustrates a cross-sectional view of a semiconductor device 1f, in accordance with some embodiments of the present disclosure. The semiconductor device 1f has a structure similar to that of the semiconductor device 1d. One of the differences between the semiconductor devices 1f and 1d is that the width of the conductive line 162 of the semiconductor device 1f is less than that of the conductive via 144. In some embodiments, the etch stop layer 164 is in contact with a portion of the side 160s1 and a portion of the side 160s2 of the barrier layer 160.

FIG. 5A to FIG. 15A, FIG. 5B to FIG. 15B, and FIG. 8C to FIG. 15C illustrate various stages of manufacturing a semiconductor device, wherein FIG. 5A to FIG. 15A are top views, FIG. 5B to FIG. 15B are cross-sectional views along line A-A' of FIG. 5A to FIG. 15A, and FIG. 8C to FIG. 15C are cross-sectional views along line B-B' of FIG. 8A to FIG. 15A, respectively.

Figure 5A:
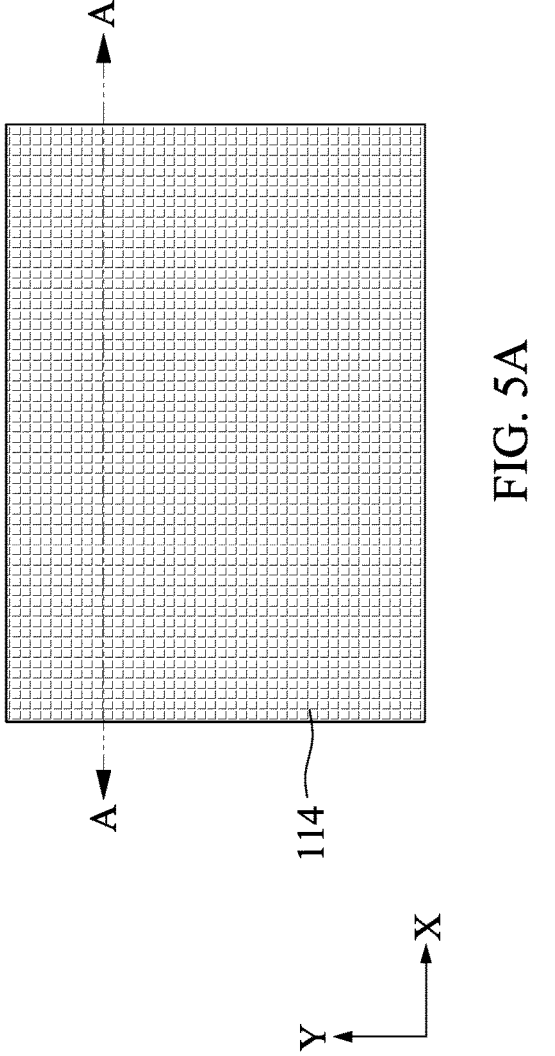
Figure 5B:
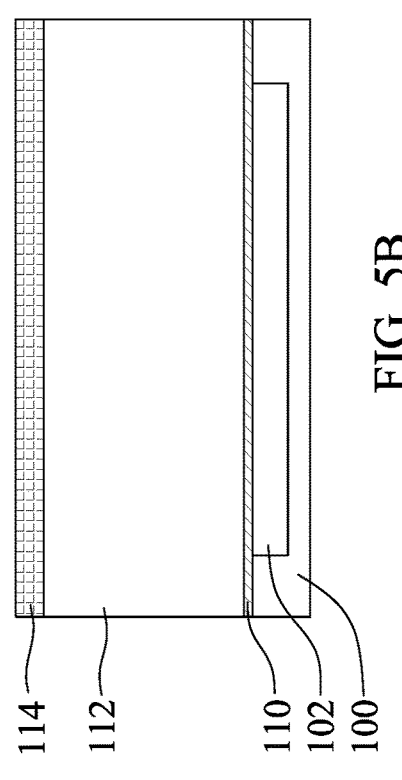

Referring to FIG. 5A and FIG. 5B, a substrate 100 is provided or received. An etch stop layer 110 is formed on the substrate 100. A dielectric layer 112 is formed on the etch stop layer 110. A mask layer 114 is formed on the dielectric layer 112. The mask layer 114 includes metal, metal nitride, metal oxide, silicon compounds, or other suitable materials. For example, the mask layer 114 includes titanium nitride, titanium oxide, tungsten, tungsten carbide, hafnium oxide, zirconium oxide, zinc oxide, silicon carbide, silicon oxide, silicon oxycarbide, silicon carbonitride, silicon oxynitride, or other suitable materials. Each of the etch stop layer 110, dielectric layer 112, and mask layer 114 is formed by chemical vapor deposition (CVD), plasma enhanced CVD (PECVD), flowable CVD (FCVD), physical vapor deposition (PVD), atomic layer deposition (ALD), or other suitable techniques.

Referring to FIG. 6A and FIG. 6B, the etch stop layer 110, dielectric layer 112, and mask layer 114 are patterned to form multiple island structures. The etch stop layer 110, dielectric layer 112, and mask layer 114 are patterned by an etching technique, such as dry etching, wet etching, or other suitable techniques. For example, a reactive-ion etching (RIE) technique may be used.

Referring to FIG. 7A and FIG. 7B, a barrier layer 120 and conductive patterns 126 are formed to fill the openings defined by the island structures of the etch stop layer 110 and the dielectric layer 112. The barrier layer 120 is formed by sputter or other suitable techniques. The conductive pattern 126 is formed by physical vapor deposition, chemical vapor deposition, plasma enhanced CVD, flowable CVD, atomic layer deposition, or other suitable techniques. In some embodiments, a conductive material is formed over the barrier layer 120, and a polishing technique is performed to remove an excess portion of the conductive material until the dielectric layer 112 is exposed, which thereby forms the conductive patterns 126. Each of the conductive patterns 126 extends along the Y direction. Further, the mask layer 114 is removed by the polishing technique. An etch stop layer 134 is formed to cover the barrier layer 120 and conductive patterns 126.

Referring to FIG. 8A, FIG. 8B, and FIG. 8C, a photosensitive material 171 is formed over the etch stop layer 134. The photosensitive material 171 defines an opening 171o1 and an opening 171o2 exposing a portion of the etch stop layer 134. The photosensitive material 171 includes a photoresist. The opening 171o1 may have a circular, oval, or a bar-shaped profile with rounded corners from a top view. The opening 171o2 may have an oval or a bar-shaped profile with rounded corners from a top view.

Referring to FIG. 9A, FIG. 9B, and FIG. 9C, a reverse material 172 is formed to fill the openings 171o1 and 171o2 and to cover the photosensitive material 171. The reverse material 172 includes silicon carbide, silicon oxide, silicon nitride, silicon carbide, silicon oxycarbide, silicon carbonitride, silicon oxynitride, or other suitable materials. The reverse material 172 is formed by spin-coating, physical vapor deposition, chemical vapor deposition, plasma enhanced CVD, flowable CVD, atomic layer deposition, or other suitable techniques. The reverse material 172 is configured to serve as a mask to cover the regions of the conductive patterns which conductive vias (e.g., V0) are formed on in subsequent stages.

Referring to FIG. 10A, FIG. 10B, and FIG. 10C, the photosensitive material 171 is removed. The portion of the etch stop layer 134 exposed by the reverse material 172 is removed. As a result, a portion of the barrier layer 120, the conductive patterns 126, and the dielectric layer 112 are exposed. The remaining reverse material 172 (or photosensitive material 171) has a circular, oval, or a bar-shaped profile with rounded corners.

Figure 11C:
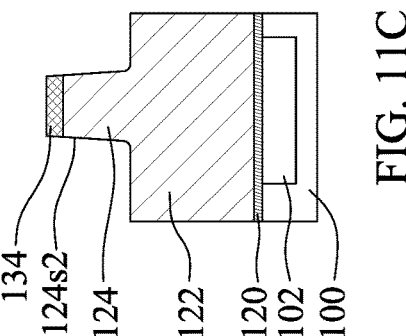
Figure 11A:
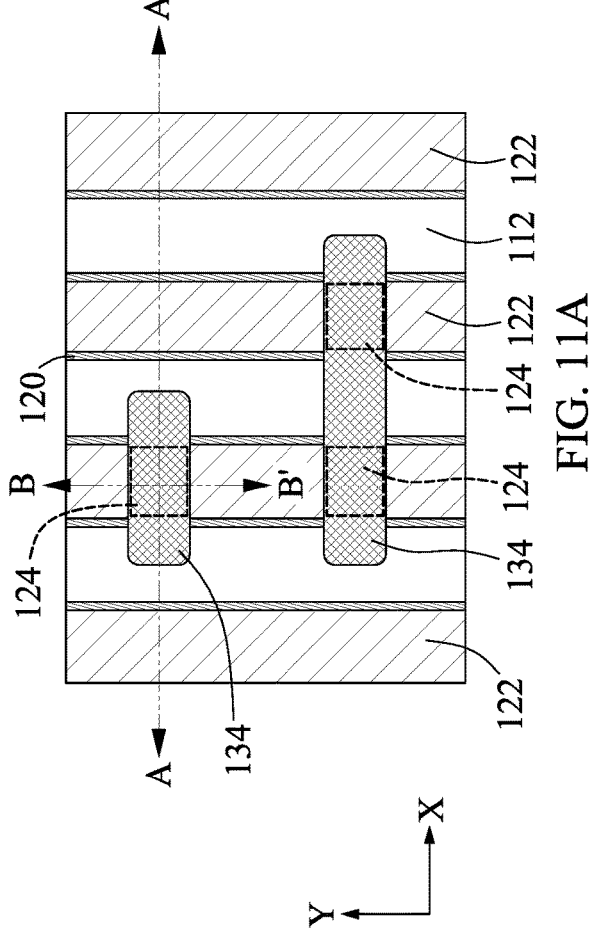
Figure 11B:
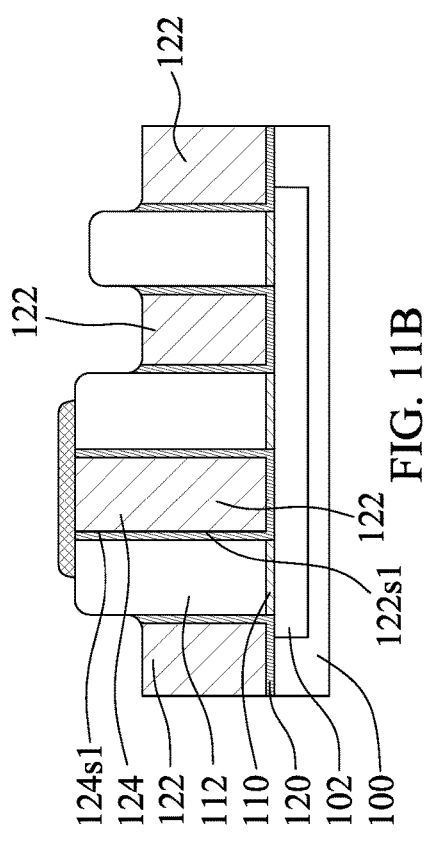

Referring to FIG. 11A, FIG. 11B, and FIG. 11C, an etching technique (e.g., reactive-ion etching technique) is performed to remove the portion of the barrier layer 120 and conductive patterns 126 exposed by the etch stop layer 134. The reverse material 172 may be partially or completely removed in this stage. The conductive patterns 126 exposed by the etch stop layer 134 define conductive lines 122, and the conductive pattern 126 covered by the etch stop layer 134 defines the conductive line 122 and conductive via 124 after the etching technique is performed. In this embodiment, the conductive line 122 and the conductive via 124 are formed or defined by removing the conductive patterns 126 exposed by the etch stop layer 134. As a result, the conductive line 122 is self-aligned to the conductive via 124, and the conductive line 122 and the conductive via 124 collectively define a monolithic structure. Since the profile of the conductive via 124 in a top view is defined by the reverse material 172 (or etch stop layer 134), the conductive via 124 may have a circular, oval, or quadrangle profile (e.g., rectangular profile or a square profile) from a top view. In some embodiments, the upper portion of the dielectric layer 112 is etched to form an upper surface with a rounded profile in a cross-sectional view. Further, since the lateral surface, in contact with the dielectric layer 112, of the conductive pattern 126 is covered by the reverse material 172 (or etch stop layer 134), the side 124s1 of the conductive via 124 is substantially coplanar with the side 122s1 of the conductive line 122.

Referring to FIG. 12A, FIG. 12B, and FIG. 12C, a protective layer 130 is conformally formed on the conductive via 124, the etch stop layer 134, the dielectric layer 112, and the barrier layer 120. A dielectric layer 132 is formed on the protective layer 130. A mask layer 136 is formed on the dielectric layer 132. The protective layer 130, the dielectric layer 132, and the mask layer 136 are formed by chemical vapor deposition, plasma enhanced CVD, flowable CVD, atomic layer deposition, physical vapor deposition, or other suitable techniques. The mask layer 136 includes titanium nitride, titanium oxide, tungsten, tungsten carbide, hafnium oxide, zirconium oxide, zinc oxide, silicon carbide, silicon oxide, silicon oxycarbide, silicon carbonitride, silicon oxynitride, or other suitable materials.

Referring to FIG. 13A, FIG. 13B, and FIG. 13C, an etching technique is performed to remove a portion of the protective layer 130, the dielectric layer 132, and the mask layer 136 to define an opening 132o1 and an opening 132o2. The etch stop layer 134 is exposed by the openings 132o1 and 132o2.

Referring to FIG. 14A, FIG. 14B, and FIG. 14C, the etch stop layer 134 is removed. As a result, the conductive vias 124 are exposed. In some embodiments, the etch stop layer 134 is removed by an etching technique (e.g., a reactive-ion etching).

Referring to FIG. 15A, FIG. 15B, and FIG. 15C, a barrier layer 140 is formed within the openings 132o1 and 132o2. Conductive lines 142 is formed on the barrier layer 140 to fill the openings 132o1 and 132o2. As a result, a semiconductor device (e.g., the semiconductor device 1a as shown in FIG. 1A to FIG. 1D) is produced.

In some embodiments, when an overlay shift occurs in the stage as shown in FIG. 13A to FIG. 13C, a portion of the etch stop layer 134 is not exposed by the openings 132o1 and 132o2. Subsequently, said portion of the etch stop layer 134 remains after an etching technique is performed. As a result, a semiconductor device (e.g., the semiconductor device 1b as shown in FIG. 2A and FIG. 2B) is produced after the barrier layer 140 and the conductive line 142 are formed.

In some embodiments, the stages as shown in FIG. 8A to FIG. 15A, FIG. 8B to FIG. 15B, and FIG. 8C to FIG. 15C may be applied to form the V1 and the M2. As a result, a semiconductor device (e.g., the semiconductor device 1d as shown in FIG. 4A) is produced.

Figure 16:
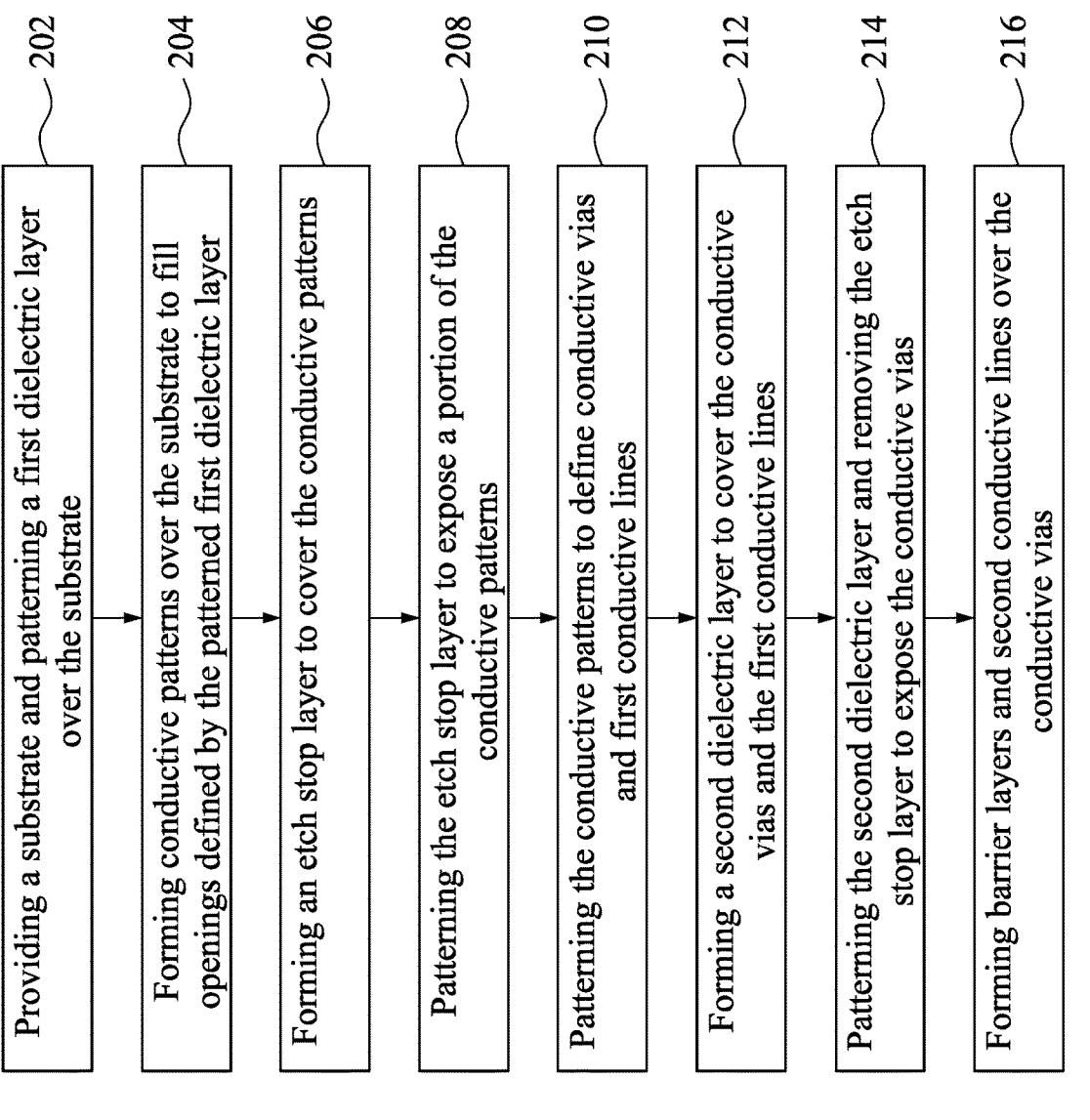
FIG. 16 is a flow chart illustrating a method for manufacturing a semiconductor device according to various aspects of the present disclosure.

FIG. 16 is a flow chart illustrating a method 200 for manufacturing a semiconductor device according to various aspects of the present disclosure.

The method 200 begins with operation 202, in which a substrate is provided. A first dielectric layer is formed over the substrate and patterned.

The method 200 continues with operation 204 in which conductive patterns are formed over the substrate to fill openings defined by the patterned first dielectric layer.

The method 200 continues with operation 206, in which an etch stop layer is formed to cover the conductive patterns.

The method 200 continues with operation 208, in which the etch stop layer is patterned to expose a portion of the conductive patterns.

The method 200 continues with operation 210, in which the conductive patterns are patterned to define conductive vias and first conductive lines.

The method 200 continues with operation 212, in which a second dielectric layer is formed to cover the conductive vias and the first conductive lines.

The method 200 continues with operation 214, in which the second dielectric layer is patterned, and the etch stop layer is removed to expose the conductive vias.

The method 200 continues with operation 216, in which barrier layers and second conductive lines are formed over the conductive vias. As a result, a semiconductor device is produced.

The method 200 is merely an example, and is not intended to limit the present disclosure beyond what is explicitly recited in the claims. Additional operations can be provided before, during, and after the method 200, and some operations described can be replaced, eliminated, or reordered for additional embodiments of the method.

Some embodiments of the present disclosure provide a semiconductor device. The semiconductor device includes a substrate, a first conductive line, a first conductive via, a second conductive line, and a first barrier layer. The first conductive line is disposed on the substrate. The first conductive via is disposed on the first conductive line. The second conductive line is disposed on the first conductive line. The first barrier layer is disposed between the first conductive via and the second conductive line.

Some embodiments of the present disclosure provide a semiconductor device. The semiconductor device includes a substrate, a first conductive line, a first conductive via, and a second conductive line. The first conductive line is disposed on the substrate. The first conductive via is disposed on the first conductive line. The second conductive line is disposed on the first conductive line. The first conductive via has a first side and a second side abutting the first side, each of which extends between the first conductive line and the second conductive line. A first slope of the first side is different from a second slope of the second side.

Some embodiments of the present disclosure provide a method of manufacturing a semiconductor device. The method includes: providing a substrate; forming a plurality of conductive patterns over the substrate; forming an etch stop layer on the conductive layer; patterning the etch stop layer to expose a portion of the plurality of conductive patterns; and removing the portion of the plurality of conductive patterns to form first conductive lines, wherein each of the plurality of conductive patterns covered by the etch stop layer define the first conductive line and a first conductive via over the first conductive line.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first conductive line disposed on the substrate, wherein the first conductive line extends along a first direction;
   a first conductive via disposed on the first conductive line;
   a second conductive line disposed on the first conductive line, wherein the second conductive line extends along a second direction different from the first direction; and
   a first barrier layer disposed between the first conductive via and the second conductive line; and
   an etch stop layer disposed on a top surface of the first conductive via.

2. The semiconductor device of claim 1, wherein the first conductive line and the first conductive via collectively define a monolithic structure.

3. The semiconductor device of claim 1, wherein the first conductive via is tapered toward the second conductive line.

4. The semiconductor device of claim 1, wherein the first conductive via has a first side and a second side abutting the first side, and a first slope of the first side is different from a second slop of the second side.

5. The semiconductor device of claim 1, wherein a sidewall of the first conductive via has a circular profile, an oval profile, or a quadrangle profile from a top view.

6. The semiconductor device of claim 1, wherein the second conductive line has a protrusion protruding toward the substrate.

7. The semiconductor device of claim 6, wherein the protrusion of the second conductive line laterally overlaps the first conductive via.

8. The semiconductor device of claim 6, wherein the second conductive line has a first side and a second side abutting the first side, and the first side of the second conductive line is spaced apart from the etch stop layer.

9. The semiconductor device of claim 1, wherein a sidewall of the first conductive via is free from laterally overlapping the etch stop layer.

10. A semiconductor device, comprising:
    a substrate;
    a first conductive line disposed on the substrate;
    a first conductive via disposed on the first conductive line; and
    a second conductive line disposed on the first conductive line,
    wherein the first conductive via has a first side and a second side abutting the first side, each of which extends between the first conductive line and the second conductive line, and a first slope of the first side is different from a second slope of the second side.

11. The semiconductor device of claim 10, further comprising:
    a first barrier layer disposed between the first conductive via and the second conductive line.

12. The semiconductor device of claim 11, wherein the first barrier layer has a first lower surface at a first height with respect to the substrate and a second lower surface at a second height with respect to the substrate, and the first height is different from the second height.

13. The semiconductor device of claim 12, wherein the second lower surface is in contact with the first conductive via, and the second height is higher than the first height.

14. The semiconductor device of claim 12, wherein the second conductive line comprises a protrusion over the first lower surface.

15. The semiconductor device of claim 10, further comprising:
    an etch stop layer disposed on a top surface of the first conductive via.

16. The semiconductor device of claim 15, wherein the second conductive line has a first side and a second side abutting the first side, the first side of the second conductive line is spaced apart from the etch stop layer, and the second side of the second conductive line is in contact with the etch stop layer.

17. The semiconductor device of claim 10, further comprising:
    a second conductive via disposed on the second conductive line, wherein the second conductive via and the second conductive line form a monolithic structure.

18. A method of manufacturing a semiconductor device, comprising:

providing a substrate;

forming a plurality of conductive patterns over the substrate;

forming an etch stop layer on the plurality of conductive patterns;

patterning the etch stop layer to expose a portion of the plurality of conductive patterns; and removing the portion of the plurality of conductive patterns to form first conductive lines, wherein each of the plurality of conductive patterns covered by the etch stop layer defines one of the first conductive lines and a first conductive via over the one of the first conductive lines.

19. The method of claim 18, further comprising:

removing the etch stop layer to expose the first conductive via; and forming a second conductive line over the first conductive via.

20. The method of claim 19, further comprising;

forming a barrier layer over the first conductive via before forming the second conductive line.

*  *  *  *  *